(12) United States Patent
Gupta et al.

(10) Patent No.: US 7,084,476 B2
(45) Date of Patent: Aug. 1, 2006

(54) INTEGRATED CIRCUIT LOGIC WITH SELF COMPENSATING BLOCK DELAYS

(75) Inventors: Puneet Gupta, LaJolla, CA (US); Fook-Luen Heng, Yorktown Heights, NY (US); David S. Kung, Chappaqua, NY (US); Daniel L. Ostapko, Mahopac, NY (US)

(73) Assignee: International Business Machines Corp., Armonk, NY (US)

( * ) Notice: Subject to any disclaimer, the term of this patent is extended or adjusted under 35 U.S.C. 154(b) by 41 days.

(21) Appl. No.: 10/787,488

(22) Filed: Feb. 26, 2004

(65) Prior Publication Data

US 2005/0189604 A1 Sep. 1, 2005

(51) Int. Cl.
*H01L 29/00* (2006.01)
(52) U.S. Cl. ..................... 257/499; 257/501
(58) Field of Classification Search ........ 257/499–510; 438/218–219; 365/205
See application file for complete search history.

(56) References Cited

U.S. PATENT DOCUMENTS 5,563,012 A   10/1996   Neisser 6,871,338 B1 *   3/2005   Yamauchi ............... 716/19
2002/0030510 A1 *   3/2002   Kono et al. ............. 326/87
2004/0208266 A1 *   10/2004   Lenosky ................. 375/346

OTHER PUBLICATIONS

Orshansky et al., A General Proabalistic Framework for Worst Case Timing Analysis, DAC 2002, Jun. 10, 2002, pp. 556-561, Published in: New Orleans, LA.

* cited by examiner

*Primary Examiner*—Hoai Pham
*Assistant Examiner*—Nathan W. Ha
(74) *Attorney, Agent, or Firm*—Law Office of Charles W. Peterson, Jr.; Louis J. Percello, Esq.; Satheesh K. Karra, Esq.

(57) ABSTRACT

An integrated circuit (IC) including at least one combinational logic path. The combinational logic path includes two types of logic blocks cells that compensate each other for fabrication parameter effects on cell transistors. The two types may be dense cells with field effect transistor (FET) gates on contacted pitch and isolated cells with FET gates on wider than contacted pitch. Dense cell delay changes from the FET gates being printed out of focus are offset by isolated cell delay changes.

25 Claims, 2 Drawing Sheets

INTEGRATED CIRCUIT LOGIC WITH SELF COMPENSATING BLOCK DELAYS

BACKGROUND OF THE INVENTION

1. Field of the Invention

The present invention generally relates to integrated circuits and more particularly to minimizing path delay variations in integrated circuits.

2. Background Description

A typical integrated circuit (IC) chip includes a stack of several levels or sequentially formed layers of shapes. Each layer is stacked or overlaid on a prior layer and patterned to form the shapes that define devices (e.g., field effect transistors (FETs)) and connect the devices into circuits. In a typical state of the art complementary insulated gate FET process, such as what is normally referred to as CMOS, layers are formed on a wafer to form the devices on a surface of the wafer. Further, the surface may be the surface of a silicon layer on a silicon on insulator (SOI) wafer. A simple FET is formed by the intersection of two shapes, a gate layer rectangle on a silicon island formed from the silicon surface layer. Each of these layers of shapes, also known as mask levels or layers, may be created or printed optically through well known photolithographic masking, developing and level definition, e.g., etching, implanting, deposition and etc.

Mask shapes each may be grouped into one of four types: line/space arrays, isolated lines, isolated spaces, and contact holes. Ideally, fabrication parameters such as process biases applied to features on a particular layer affects all types of features uniformly on that layer. Unfortunately, all feature types do not respond uniformly. In particular, isolated lines and minimum pitch line/space arrays known as contact pitch lines behave differently to focus. Contacted pitch lines are minimum pitch line/space arrays on a particular layer in the minimum line width and spacing plus additions for via or contact covers or landing pads. When printed out-of-focus, contact pitch lines get wider (and spaces shrink), while isolated lines get narrower. This dichotomy has become especially troublesome as image dimensions have shrunk.

Since, typically, devices are much wider than they are long, the typical device has a short gate (and corresponding channel), i.e., the minimum shape dimension. Device current is inversely proportional to device length. Device performance is inversely related to device current (lower current means longer delays) and power is related to the square of device current. To densely pack a circuit such as a two bit adder or other complicated logic function, contact pitch lines are formed over silicon islands with device widths being in the direction of the length and device lengths being the line width. A multiplier built from such two bit adders may include a number of such two bit adders in the signal path for a single bit. Thus, longer gate delays from printing the multiplier gate layer slightly out-of-focus is cumulative and, essentially, each two bit adder slows that signal path by the same amount with the overall result being the sum of the individual additional delay. By contrast simpler logic functions such as inverters or buffers may be formed with less dense or even isolated gates. A typical clock tree may be a series of such inverters and, as with the multiplier, the effect of printing the isolated clock tree gates is cumulative, shortening the delays by the sum of individual reductions. For timing critical applications, e.g., where the clock is gating a latch at the multiplier output, the later arrival of the multiplier results and earlier arrival of the clock can cause the latch to latch wrong data.

Thus, there is a need for reduced improved immunity to fabrication parameter variations in integrated circuit chip circuits.

SUMMARY OF THE INVENTION

It is a purpose of the invention to minimize fabrication parameter variations in integrated circuit chip circuits;

It is another purpose of the invention to minimize circuit sensitivity to gate layer focus variations;

It is yet another purpose of the invention to reduce logic path variability.

The present invention relates to an integrated circuit (IC) including at least one combinational logic path. The combinational logic path includes two types of logic blocks cells that compensate each other for fabrication parameter effects on cell transistors. The two types may be dense cells with field effect transistor (FET) gates on contacted pitch and isolated cells with FET gates on wider than contacted pitch. Dense cell delay changes from the FET gates being printed out of focus are offset by isolated cell delay changes.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
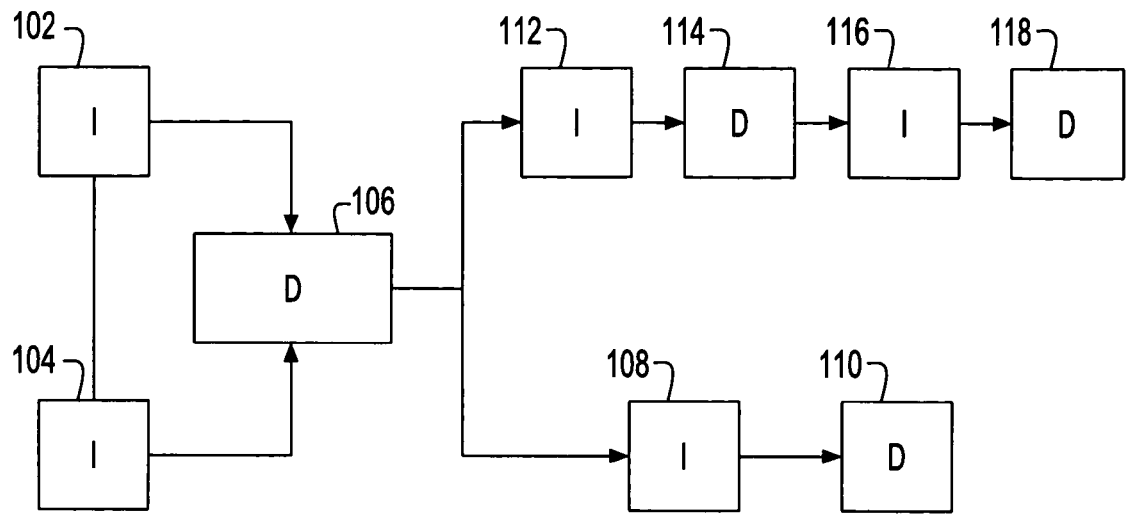
FIG. 1 shows an example of combinational logic in a cross section according to a preferred embodiment of the present invention.

Turning now to the drawings and, more particularly, FIG. 1 shows an example of combinational logic in a cross section 100 according to a preferred embodiment of the present invention. The cross section 100, which may be on or part of an integrated circuit (IC) chip, includes logic blocks 102, 104, 106, 108, 110,112, 114, 116, 118, e.g., standard cell logic gates or macros, selected to compensate each other for individual performance deviations from nominal. In this particular example, alternating logic blocks are selected to have an opposite performance response to a particular fabrication parameter, e.g., focus variation in printing one or more mask level. So, for example, as a particular level (e.g., device or field effect transistors (FETs) gate layer) is printed on a chip site more and more out-of-focus, chip delay increases through logic blocks 102, 104, 108, 112 and 116 and decreases through logic blocks 106, 110, 114 and 118. Similarly, as the level is printed on another more and more in-focus, chip delay on that chip decreases through logic blocks 102, 104, 108, 112 and 116 and increases through logic blocks 106, 110, 114 and 1118. Advantageously, irrespective of individual gate performance, overall path delay is held more or less uniform and closer to nominal.

Thus, as noted hereinabove, spacing decreases and line width increases for denser, contacted pitch lines when the level is printed out-of-focus; simultaneously, spacing increases and line width decreases in isolated lines that are spaced farther apart in a wider pitch. Since device length tracks line width, out-of-focus densely formed FET gates are longer and isolated FET gates are shorter. By contrast, using an alternating phase shift mask, for example has an opposite effect on gate length, i.e., gate length increases for isolated pitch device gates and decreases for dense pitch device gates. So, by constructing both isolated and dense cell layouts for each logic block, for example, cell types (isolated and dense or, I and D) can be mixed in any logic path to mitigate focus effects, for example, on individual block delays. Of course, it is understood that including both cell layouts might incur some area penalty and the path might further be optimized to reduce that area penalty.

So, a typical preferred embodiment standard cell library includes at least two layouts for each logic book (whether a simple function, a more intermediate or complex function or macro), i.e., a dense layout and an isolated layout. Generally, dense layout cells are laid out with minimum spacing distance between adjacent, minimum length transistors everywhere except across a diffusion break, which provides an automatic isolated spacing distance. A dummy transistor that is always off (i.e., the gate is tied to VDD for P-type FETs (PFETs) and to ground for N-type FETs (NFETs)) is included bridging each diffusion break to maintain effective gate density without changing the cell logic. Thus, the spacing distance is maintained at minimum between adjacent transistors in each dense cell. Further, transistors (including dummy transistors) are placed at the cell boundaries at half the contacted pitch from the boundary. So, when two such cells are placed side by side the cell density is maintained even at cell boundaries. By contrast the spacing between adjacent transistors in isolated layout cells is greater than the contacted or minimum pitch. Optionally, isolated gates may be included at the boundaries of each isolated layout cell to reduce the uncertainty of spacing distance between boundary transistors and neighboring transistors in adjacent cells.

Continuing the example of FIG. 1, each of the standard cell logic blocks 102, 104, 106, 108, 110, 112, 114, 116, 118 is selected from a dense (D) and an isolated (I) pair of standard cell books for each particular logic function. So, by design, one of each pair is affected favorably when a particular fabrication parameter (e.g., focus) is towards a first extreme and unfavorably towards the other, opposite second extreme; the other of the pair provides an opposite effect to the same fabrication parameter, e.g., slows when the level prints out-of-focus and is faster when the level prints in focus. Thus, this particular example is shown with each path (i.e., from 102 to 110 or 118 or, from 104 to 110 or 118) including, roughly, an equal number of each type. For example, logic blocks 102, 104, 108, 112 and 116 are books laid out (e.g., with isolated gates) for a particular effect to variations of a particular fabrication parameter (gate layer focus) and logic blocks 106, 108, 114 and 118 are books laid out (with contacted pitch or dense gates) for the opposite effect. It should be noted that both layouts of the same book may be included in the same logic path, e.g., 104 and 106 may both be AND gates. Regardless of the particular function provided by each logic block 102, 104, 106, 108, 110, 112, 114, 116, 118, all will be formed under the same conditions. So, should the gates be printed out-of focus, for example, the longer block delay through dense logic blocks 106, 108, 114 and 118 offsets reduced delay through isolated logic blocks 102, 104, 108, 112 and 116. Although the mix in this example shows alternating dense and isolated blocks 102, 104, 106, 108, 110, 112, 114, 116, 118, this is for example only. Instead, normally, increased delay in one gate does not offset an equal decrease in delay in another gate in the same path. Thus, it may be necessary to determine an appropriate mix of layout types to neutralize path delay variations, e.g., how many blocks should be isolated layout books and how many blocks should be dense layout books.

Figure 2:
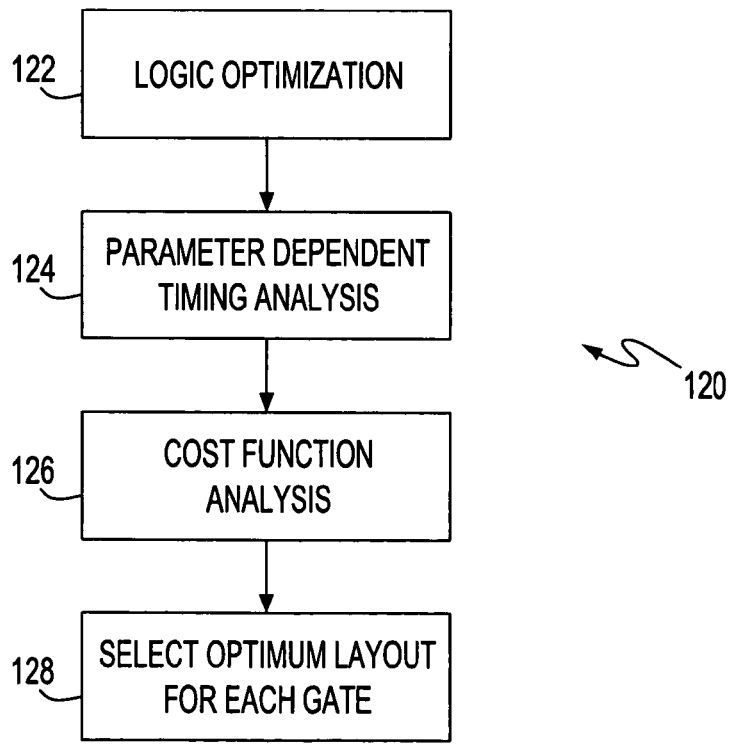
FIG. 2 shows an example of a flow diagram for selecting an appropriate mix of gate layouts for a logic design.

FIG. 2 shows an example of a flow diagram 120 for selecting an appropriate mix of book layouts for a logic design according to a preferred embodiment of the present invention. First, in step 122 the logic design is synthesized using available basic building block circuits (e.g., NAND and NOR gates), which are placed and then routed. Coincidentally, the placed design is analyzed with optimization program to combine and remove gates. In typical state of the art synthesis tools, logic optimization may be combined with placement to achieve more optimal result. Of concern for this example is the dense and isolated gate sensitivity to gate layer focus and, dense and isolated layouts are included for each book in a standard cell library with timing characteristics for each, both in and out-of-focus. A layout for each book is selected considering gate sensitivity to focus and exploiting individual book and layout effects to reduce the path delay variations of a particular design. So, in step 124 the optimized logic is analyzed for sensitivities to the particular fabrication parameter, gate layer focus in this example. The analysis may be directed to determining cell leakage and/or timing responses to the fabrication parameter. So, for an example of cell timing response analysis, a dominant input pin may be identified (i.e., the latest arriving input signal for a particular block) and gate delay variations can be considered to determine weighting factors for each. Also, when power variation is a consideration, device threshold leakage variations can be considered. Then, in step 126 the path is described in terms of a cost function that quantifies path variations with respect to the cumulative weighted cell variations, i.e., both increases and decreases in book delay. The cost function is minimized to minimize overall path variation. Finally, in step 128 one of the pair layouts is selected for each cell in the path based upon the minimized cost function. Thus, the result of the above analysis for the example of FIG. 1 may indicate that block 106 is dominant and so, is assigned a dense cell layout and, the remaining cells 102, 104, 108, 110, 112, 114, 116, 118 are assigned isolated cell layouts.

In the cost function analysis of step 126 for a network of N (9 in the example of FIG. 1) nodes of which t are primary output nodes, v are internal nodes and s are primary input nodes, the set of nodes may be denoted by $\{g_1, g_2, \ldots g_{t+v's}\}$. So, with reference to the network or cross section 100 in FIG. 1, primary output nodes or blocks 110 and 118 have one input pin, no output pins and may be indexed from 1 to t. Internal nodes 106, 108, 112, 114 and 116 have one or more input pins, one output pin and may be indexed from t+1 to t+v. Primary input nodes 102 and 104 have no input pins, one output pin and are indexed from t+v+1 to t+v+s. The output pin of each node $g_i$ is connected to a net $n_i$ that in turn is connected to the input pins of other nodes. A two value selection variable $x_i$ can be assigned to each gate $g_i$ to designate the selected layout for the corresponding gate, e.g., +1 designating a dense layout gate type and −1 designating an isolated layout gate type. The corresponding gate variation $v_i$ is a previously determined value for each layout and included in the library definition for the book. A variation variable $a_j$ is determined from this for the output of each node $g_j$. The variation variables of pins connected by a common net are the same and the variation variable of the output pin of each primary input gate is 0. Thus, generally, $a_i = a_k + x_j v_j$, where $a_k$ is the variation variable of the dominant pin of $g_j$ and all the variation variables are linear functions of the selection variables.

Depending upon whether minimizing variations in path delay or in path power is of concern, an appropriate cost function can be defined and minimized. For minimizing path delay variations weighting factors $w_i$ can be applied to the variation variables and the resulting cost function is $$C = \sum_{\text{primary outputs}} w_i |a_i|,$$

which is minimized subset to the constraints $x_i \in \{-1,1\}$ for each gate. Similarly, since the dense layout cells consume less leakage power, leakage power can be reduced with an acceptable increase in variation on selected paths, especially for non-critical paths. Thus, representing the leakage power consumed by dense layout gates $g_i$ being $p_i^D$ and isolated layout gates being $p_i^I$, the resulting cost function is $$C_L = \sum_i (p_i^D - p_i^I) x_i$$

subject to the constraints $a_i \leq b_i \forall t+1 \leq i \leq t+v$, where the $b_i$'s are the variation thresholds and, again, to $x_i \in \{-1,1\}$.

Figure 3A:
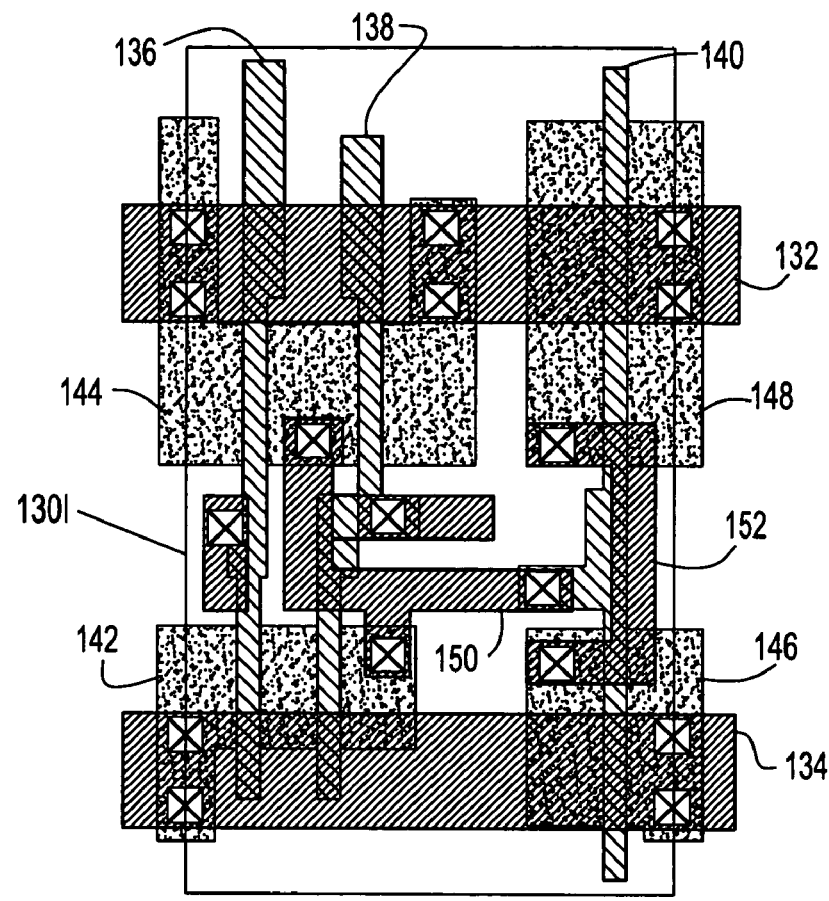
FIGS. 3A–B show an example of a two input AND gate pair of isolated and dense layouts such as may be included in a typical standard cell for selection in minimizing path variations.
Figure 3B:
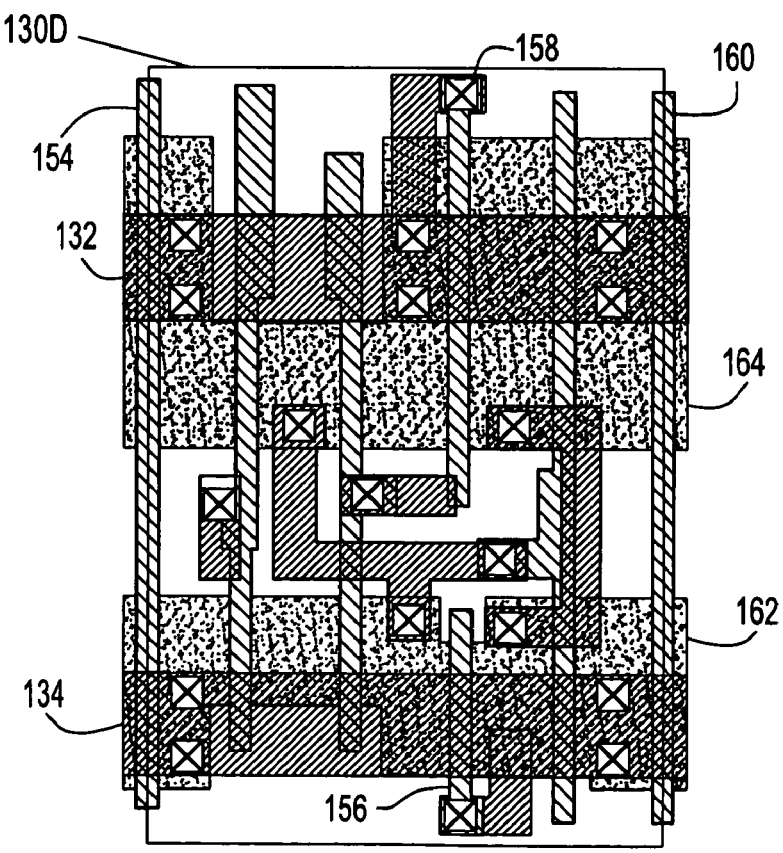

FIGS. 3A–B show an example of a two input AND gate pair of isolated and dense layouts 130I, 130D, such as may be included in a typical standard cell for selection in minimizing path variations according to a preferred embodiment of the present invention. In this example, supply lines 132, 134 provide local connection to a supply voltage, e.g., $V_{hi}$ or $V_{DD}$, and ground, respectively. PFETs are formed at the supply line 132. NFETs are formed at the ground line 134. Gate layer shapes 136, 138, 140 intersect with silicon island shapes 142, 144, 146, 148 to form NFETs and PFETS. Thus, AND input gate layer shapes 136, 138 form series connected NFETs with silicon n-type island 142 and parallel connected PFETs with p-type silicon island 144. Similarly, gate layer shape 140 forms an NFET with silicon n-type island 146 and a PFET with p-type silicon island 148. A metal strap 150 connects the common connection of the PFETs with the series connected NFETs forming a NAND gate output and also to gate layer shape 140, which is an internal inverter input. A second metal strap 152 is the output of the inverter and, consequently, the AND gate output. Other than over n-type silicon island 146, gate layer shapes 136, 138, 140 are spaced apart by more than minimum spacing and, by no means would the shapes 136, 138, 140 be considered on minimum or contact pitch.

By contrast, in the dense layout 130D of FIG. 3B, extra gate layer shapes 154, 156, 158, 160 are included to force the gate layer line spacing to be at or near contact pitch within the dense cell 130D. Also, instead of individual silicon island shapes 142, 144, 146, 148 internal shapes, larger merged islands 162, 164 are provided. Internally, extra gate layer shapes 156, 158 form off FETs (i.e., shape 156 is tied to VDD and forms a PFET at P-type merged island 164 and the shape 156 is tied to ground and forms an NFET at N-type merged island 162) with shape 156 isolating the NAND gate output at conductive strap 150 from the AND gate output at conductive strap 152 and shape 158 isolating the AND gate output from supply line 132. Thus, the off devices formed by extra gate layer shapes 156, 158 effectively divide larger merged islands 162, 164 into areas equivalent to silicon island shapes 142, 144, 146, 148 in the isolated cell layout 130I. Border shapes 154 and 160 insure pitch and spacing with adjacent cells (not shown).

Thus, advantageously, a preferred embodiment standard cell library, includes two fabrication parameter (e.g., focus variation) dependent layouts, each having an opposite response as the other to changes in the particular fabrication parameter. So, when the fabrication parameter is away from nominal, cells formed using one of the two layouts provides more favorable operation and cells formed using the second provide less favorable, e.g., an isolated gate cell that decreases delay and a dense cell that increases delay as the gate level is printed more and more out-of-focus. Cells layouts are selected, primarily, in a timing path for tuned and balanced logic s that is relatively insensitive to variations in the particular fabrication parameter. Moreover, ancillary effects may be considered with or instead of this primary effect, e.g., for the particular focus sensitive gate layer example, because the effective gate length of out-of-focus dense layout blocks, they consume less power and, in particular, leakage power. Thus, dense layout cells can be used in non-critical timing paths to reduce total design leakage power.

While the invention has been described in terms of preferred embodiments, those skilled in the art will recognize that the invention can be practiced with modification within the spirit and scope of the appended claims.

What is claimed is:

1. An integrated circuit (IC) including at least one combinational logic path, said at least one combinational logic path comprising a plurality of logic blocks, at least one layer in said at least one logic path having areas of contacted pitch shapes and areas of shapes spaced wider than said contacted pitch.

2. An IC as in claim 1 wherein said logic blocks are CMOS logic circuits, each comprising one or more field effect transistors (FETs).

3. An IC as in claim 2 wherein logic blocks include at least one dense cell and at least one isolated cell, said contacted pitch shapes being in dense cells, delay changes in said dense cells from said at least one layer printing out-of-focus being offset by delay changes in isolated cells.

4. An IC as in claim 3 wherein said delay changes in said dense cells are increases in dense cell delays.

5. An IC as in claim 3 wherein at least one said dense cell is the same logic circuit as at least one said isolated cell.

6. An IC as in claim 3 wherein said at least one layer is a FET gate layer.

7. An IC as in claim 6 wherein at least one said dense cell includes at least one shape not included in a logic circuit, FET gates in said dense cell being on said contacted pitch with said at least one shape and, being on a pitch wider than said contacted pitch without said at least one shape.

8. An IC as in claim 7 wherein said at least one shape in at least one said dense cell is the gate of an FET tied off.

9. An IC as in claim 3 further comprising at least one second combinational logic path, said at least one second combinational logic path consisting of a plurality dense logic cells, power in said at least one second logic path being reduced from said FET gate layer being printed out of focus.

10. An IC as in claim 1 wherein IC is a standard cell IC.

11. A standard cell CMOS integrated circuit (IC) chip, at least one combinational logic path comprising a plurality of standard cell logic blocks, said plurality of logic blocks including at least one dense cell and at least one isolated cell, gate layer shapes in said dense cell being on a contacted pitch and gate layer shapes in said isolated cell being on a pitch wider than said contacted pitch, whereby delay changes in said dense cells from said gate layer shapes being printed out-of-focus being offset by delay changes in isolated cells.

12. A standard cell CMOS IC chip as in claim 11 wherein said logic blocks are logic circuits, each comprising one or more field effect transistors (FETs).

13. An standard cell CMOS IC chip as in claim 12 wherein said delay changes in said dense cells are increases in dense cell delays.

14. An standard cell CMOS IC chip as in claim 13 wherein at least one said dense cell is the same logic circuit as at least one said isolated cell.

15. An standard cell CMOS IC chip as in claim 13 wherein at least one said dense cell includes at least one shape not included in a logic circuit, FET gates in said dense cell being on said contacted pitch with said at least one shape and, being on a pitch wider than said contacted pitch without said at least one shape.

16. An standard cell CMOS IC chip as in claim 15 wherein said at least one shape in at least one said dense cell is the gate of an FET tied gate to source.

17. An standard cell CMOS IC chip as in claim 12 further comprising at least one second combinational logic path, said at least one second combinational logic path consisting of a plurality dense logic cells, power in said at least one second logic path being reduced from said FET gate layer being printed out of focus.

18. An integrated circuit (IC) including at least one combinational logic path, said at least one combinational logic path comprising a plurality of logic blocks, at least one of said logic blocks being a first type cell, wherein at least one said first type cell includes at least one FET tied off, and at least one other of said logic blocks being a second type cell, a fabrication parameter having a first effect on said first type cell and a opposite effect on said second type cell, and wherein said logic blocks are CMOS logic circuits, each comprising one or more field effect transistors (FETs).

19. An IC as in claim 18 wherein said first cell type is a dense cell type, FET gates being on contact pitch within each said dense cell.

20. An IC as in claim 1 wherein said second cell type is an isolated cell type, FET gates being on a pitch greater than said contact pitch within each said isolated cell.

21. An IC as in claim 18 wherein said fabrication parameter is focus variation for an FET gate layer.

22. An IC as in claim 21 wherein said first effect is an increase in block delay from said FET gate layer being printed out of focus.

23. An IC as in claim 22 wherein said first cell type is a dense cell type, FET gates being on contact pitch within each said dense cell and said second cell type is an isolated cell type, FET gates being on a pitch greater than said contact pitch within each said isolated cell, whereby cumulative increase in block delay for each said dense cell in said at least one combinational logic path is offset by cumulative decrease in block delay for each said isolated cell in said at least one combinational logic path.

24. An IC as in claim 22 further comprising at least one second combinational logic path, said at least one second combinational logic path consisting of a plurality dense logic cells, power in said at least one second logic path being reduced from said FET gate layer being printed out of focus.

25. An IC as in claim 18 wherein IC is a standard cell IC.

* * * * *